US010756056B2

(12) United States Patent
Liu

(10) Patent No.: US 10,756,056 B2
(45) Date of Patent: Aug. 25, 2020

(54) METHODS AND STRUCTURES FOR WAFER-LEVEL SYSTEM IN PACKAGE

(71) Applicant: Ningbo Semiconductor International Corporation, Ningbo (CN)

(72) Inventor: Mengbin Liu, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 7 days.

(21) Appl. No.: 16/176,098

(22) Filed: Oct. 31, 2018

(65) Prior Publication Data

US 2019/0115314 A1 Apr. 18, 2019

Related U.S. Application Data

(63) Continuation of application No. PCT/CN2018/093770, filed on Jun. 29, 2018.

(30) Foreign Application Priority Data

Sep. 30, 2017 (CN) .......................... 2017 1 0917071
Sep. 30, 2017 (CN) .......................... 2017 1 0919199
Jan. 24, 2018 (CN) .......................... 2018 1 0070261

(51) Int. Cl.
*H01L 29/40* (2006.01)
*H01L 25/065* (2006.01)
(Continued)

(52) U.S. Cl.
CPC ........ *H01L 25/0652* (2013.01); *H01L 21/486* (2013.01); *H01L 21/56* (2013.01); *H01L 21/565* (2013.01); *H01L 21/6835* (2013.01); *H01L 21/76898* (2013.01); *H01L 23/3107* (2013.01); *H01L 23/3121* (2013.01); *H01L 23/481* (2013.01); *H01L 23/5384* (2013.01); *H01L 23/5386* (2013.01); *H01L 23/5389* (2013.01);
(Continued)

(58) Field of Classification Search
CPC . H01L 21/76898; H01L 21/486; H01L 21/56; H01L 23/481; H01L 23/5384; H01L 23/5389; H01L 23/3121; H01L 23/3107; H01L 23/5386; H01L 23/2409; H01L 23/02; H01L 23/11; H01L 25/0652
USPC .......................................................... 257/621
See application file for complete search history.

(56) References Cited

U.S. PATENT DOCUMENTS 8,841,777 B2 * 9/2014 Farooq ................ H01L 21/2007
257/777
9,502,344 B2 11/2016 Margalit
(Continued)

FOREIGN PATENT DOCUMENTS

| CN | 101740421 A | 6/2010 |
| CN | 104009014 A | 8/2014 |
| CN | 106449672 A | 2/2017 |

*Primary Examiner* — Luan C Thai
(74) *Attorney, Agent, or Firm* — Anova Law Group, PLLC

(57) ABSTRACT

The present disclosure provides a packaging method for wafer-level system in package. The packaging method for wafer-level system in package includes bonding at least two wafers together along a stacking direction perpendicular to surfaces of the at least two wafers, each wafer containing a plurality of chips. The bonding includes adjoining two wafers to-be-bonded together, and after adjoining, forming a plurality of plugs to electrically connect the plurality of chips in the two wafers.

20 Claims, 6 Drawing Sheets

(51) Int. Cl.
  *H01L 23/538* (2006.01)
  *H01L 23/00* (2006.01)
  *H01L 21/48* (2006.01)
  *H01L 21/56* (2006.01)
  *H01L 25/00* (2006.01)
  *H01L 21/683* (2006.01)
  *H01L 23/31* (2006.01)
  *H01L 21/768* (2006.01)
  *H01L 23/48* (2006.01)

(52) U.S. Cl.
  CPC .............. *H01L 24/02* (2013.01); *H01L 24/09* (2013.01); *H01L 24/11* (2013.01); *H01L 24/16* (2013.01); *H01L 24/17* (2013.01); *H01L 24/19* (2013.01); *H01L 24/32* (2013.01); *H01L 24/80* (2013.01); *H01L 24/81* (2013.01); *H01L 24/83* (2013.01); *H01L 24/94* (2013.01); *H01L 24/96* (2013.01); *H01L 25/00* (2013.01); *H01L 25/50* (2013.01); *H01L 24/13* (2013.01); *H01L 24/20* (2013.01); *H01L 24/97* (2013.01); *H01L 2221/68381* (2013.01); *H01L 2224/02372* (2013.01); *H01L 2224/0345* (2013.01); *H01L 2224/1132* (2013.01); *H01L 2224/11334* (2013.01); *H01L 2224/11849* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/16145* (2013.01); *H01L 2224/16225* (2013.01); *H01L 2224/32145* (2013.01); *H01L 2224/80894* (2013.01); *H01L 2224/81005* (2013.01); *H01L 2224/81191* (2013.01); *H01L 2224/81815* (2013.01); *H01L 2224/81986* (2013.01); *H01L 2224/83005* (2013.01); *H01L 2224/8385* (2013.01); *H01L 2224/83896* (2013.01); *H01L 2224/92224* (2013.01); *H01L 2224/94* (2013.01); *H01L 2224/96* (2013.01); *H01L 2224/97* (2013.01); *H01L 2924/0105* (2013.01); *H01L 2924/01029* (2013.01); *H01L 2924/13091* (2013.01); *H01L 2924/1431* (2013.01); *H01L 2924/1461* (2013.01); *H01L 2924/181* (2013.01); *H01L 2924/3511* (2013.01)

(56) References Cited

U.S. PATENT DOCUMENTS

2008/0191310 A1* 8/2008 Wu .................... H01L 21/2007
                                                    257/508
2012/0142136 A1    6/2012 Horning et al.

* cited by examiner

METHODS AND STRUCTURES FOR WAFER-LEVEL SYSTEM IN PACKAGE

CROSS-REFERENCES TO RELATED APPLICATIONS

This application is a continuation application of PCT patent application No. PCT/CN2018/093770, filed on Jun. 29, 2018, which claims the priority of Chinese patent application Nos. CN201810070261.9, filed on Jan. 24, 2018, CN201710917071.1, filed on Sep. 30, 2017, and CN201710919199.1, filed on Sep. 30, 2017, the entire content of all of which is incorporated herein by reference.

FIELD OF THE DISCLOSURE

The present disclosure generally relates to the field of semiconductor fabrication technology and, more particularly, relates to methods and structures for wafer-level system in package.

BACKGROUND

System in package (SiP) combines a plurality of active components, passive components, micro-electromechanical systems (MEMS), optical components, and other components having different functions into one unit to form a system or a subsystem that is capable of providing multiple functions. SiP allows heterogeneous integration of integrated circuits (ICs), and appears to be a desired package integration technique. Compared to system on chip (SoC) package, SiP is relatively simple and demonstrates advantages of shorter design cycle, shorter time-to-market cycle, and lower cost. Therefore, SiP can be used for the implementation of more complex systems.

Compared to conventional SiP, the wafer-level packaging (WLP) is a package integration process that is completed based on wafers. The WLP demonstrates various advantages, such as greatly reducing the area size of the package structure, reducing the manufacturing costs, optimizing the electrical performance, supporting batch manufacturing, etc. These advantages demonstrated by the WLP can significantly reduce the workload and the requirements on equipment.

Given the significant advantages of the WLP, how to better implement WLP has always been a hot research topic in the industry. The disclosed methods and structures for wafer-level SiP are directed to improve the implementation of WLP.

BRIEF SUMMARY OF THE DISCLOSURE

One aspect of the present disclosure provides a packaging method for wafer-level system in package (SiP). The packaging method includes bonding at least two wafers together along a stacking direction perpendicular to surfaces of the at least two wafers. Each wafer contains a plurality of chips, and the bonding includes adjoining two wafers to-be-bonded together; and after adjoining, forming a plurality of plugs to electrically connect the plurality of chips in the two wafers.

Optionally, each wafer includes a front side surface and, opposite to the front side surface, a back side surface. Adjoining the two wafers includes bonding the two wafers with the front side surface of one wafer facing to the front side surface of the other wafer; or bonding the two wafers with the front side surface of one wafer facing to the back side surface of the other wafer.

Optionally, when the front side surface of one wafer is bonded to the other wafer, prior to forming the plurality of plugs, a thinning-down process is performed on the back side surface of a wafer with the back side surface facing outside to reduce the thickness of the wafer to a target thickness. The thinning-down process includes at least one of mechanical grinding, chemical mechanical polishing, and etching.

Optionally, each wafer includes a front side surface and, opposite to the front side surface, a back side surface. Adjoining the two wafers includes bonding the two wafers with the back side surface of one wafer facing to the back side surface of the other wafer.

Optionally, when the back side surface of one wafer is bonded to the back side surface of the other wafer, prior to adjoining the two wafers, a thinning-down process is performed on the back side surface of one of the two wafers to reduce the thickness of the wafer to a target thickness. The thinning-down process includes at least one of mechanical grinding, chemical mechanical polishing, and etching.

Optionally, forming the plurality of plugs further includes forming a plurality of vias in at least one wafer of the two wafers that are bonded together; and filling a conductive material into each via to form a plug electrically connected to a corresponding chip.

Optionally, each plug is formed above a corresponding chip, or the plurality of plugs are formed on one side of the plurality of chips and are electrically connected to the plurality of chips through a plurality of interconnection wires formed prior to forming the plurality of plugs.

Optionally, after forming the plurality of plugs, the packaging method further includes forming a redistribution interconnection structure to electrically connect each plug.

Optionally, the redistribution interconnection structure includes a rewiring layer and a soldering pad, or a soldering pad only.

Optionally, at least three wafers, each wafer containing a plurality of chips, are bonded together along the direction perpendicular to the surfaces of the at least three wafers.

Optionally, when at least three wafers are bonded together, the packaging method for wafer-level SiP includes providing another wafer containing a plurality of chips, and further bonding the another wafer with one wafer of a plurality of bonded wafers.

Optionally, the two wafers are bonded through a fusion bonding process, a silicon-silicon direct bonding process, or an adhesive bonding process.

Another aspect of the present disclosure provides a wafer-level SiP structure. The wafer-level SiP structure includes at least two wafers, each wafer containing a plurality of chips, bonded along a direction perpendicular to surfaces of the at least two wafers; and a plurality of plugs, electrically connecting the plurality of chips in the at least two wafers.

Optionally, the wafer-level SiP structure includes two wafers that are bonded together. Each of the two wafers includes a front side surface and, opposite to the front side surface, a back side surface. In the wafer-level SiP structure, the front side surface of one wafer is bonded to the front side of the other wafer; or the front side surface of one wafer is bonded to the back side of the other wafer; or the back side surface of one wafer is bonded to the back side surface of the other wafer.

Optionally, each plug is formed above a corresponding chip.

Optionally, the plurality of plugs are formed on one side of the plurality of chips, and the wafer-level SiP structure further includes a plurality of interconnection wires, formed on a same side of the plurality of chips as the plurality of plugs, and electrically connecting the plurality of plugs and the plurality of chips.

Optionally, the wafer-level SiP structure further includes a plurality of redistribution interconnection structures, each formed above and electrically connected to a plug.

Optionally, the redistribution interconnection structure includes a rewiring layer and a soldering pad, or a soldering pad only.

Optionally, the wafer-level SiP structure further includes a bonding layer formed at an interface between wafers that are bonded together.

Optionally, the wafer-level SiP structure further includes a passivation layer covering the plurality of redistribution interconnection structures.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1A:
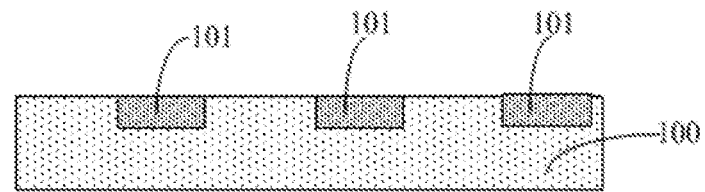
FIGS. 1A-1E illustrate schematic cross-sectional views of structures at certain stages of an exemplary packaging method for bonding two wafers, each wafer containing a plurality of chips, in a stacking direction perpendicular to the surfaces of the wafers according to an embodiment of the present disclosure.
Figure 1A:
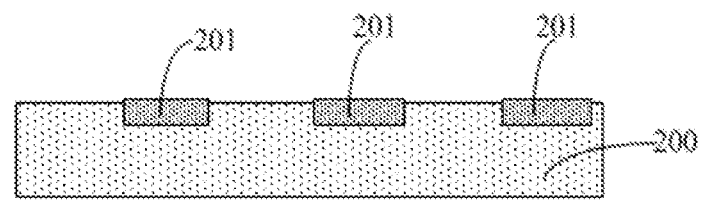

In the following description, numerous specific details are set forth to provide a more thorough understanding of the disclosure. However, it will be apparent to those skilled in the art that the present disclosure may be implemented without one or more of these details. In other instances, some of the technical features well known in the art are described herein to avoid confusion with the present disclosure.

It should be understood that the disclosed methods and structures can be implemented in various forms and should not be construed as limited to the embodiments set forth in the present disclosure. Instead, these embodiments are provided so that the present disclosure will be thorough and complete. In the accompanying drawings, the size and relative dimensions of the layers and regions may be enlarged for clarity. The same reference numbers indicate the same elements throughout the present disclosure.

It should be understood that when an element or layer is referred to as "on", "adjacent to", "connected to" or "coupled to" another element or layer, it may be directly placed on the other element or layer, or may be adjacent to, connected to, or coupled to the other element or layer. Alternatively, the element or layer may be indirectly placed on the other element or layer, or may be adjacent to, connected to, or coupled to the other element or layer as some intermediate elements and/or layers are disposed between. In contrast, when an element is referred to as "directly on", "directly adjacent to", "directly connected to", or "directly coupled to" another element or layer, no intermediate element or layer is disposed between.

It should be understood that although the terms such as first, second, third, etc. are used to describe various components, regions, layers, and/or portions, these components, regions, layers, and/or portions should not be limited by the terms of first, second, third, etc. These terms are merely used to distinguish an element, component, region, layer, or portion. Therefore, a first element, component, region, layer, or portion discussed in the present disclosure may be alternatively represented as a second element, component, region, layer, or portion.

Spatial relationship terms such as "under", "below", "the lower", "underneath", "above", "the upper", etc. are used here for illustrative purposes. The terms may be used to describe the relationship of one element or feature shown in a figure with respect to other elements or features. It should be understood that in addition to the orientation shown in the figures, the spatially relative terms are intended to encompass different orientations of the device in use and operation. For example, when a device in the figures is flipped, an element or feature described as "under another element", "under", or "below" may be oriented "above" the other element or feature. Thus, the exemplary terms "below" and "under" may include both up and down directions. A device may be otherwise oriented (e.g. rotated 90 degrees or oriented to other orientation), and the spatial descriptive terms used herein may be interpreted accordingly.

The terms used herein are merely for the purpose of describing the particular embodiments and are not intended to limit the scope of the present disclosure. When using the singular forms such as "a", "one", and "the/this", these terms are also intended to include the plural forms, unless otherwise specified in the context. It should also be understood that when the terms "composed of" and/or "comprising" are used in the specification, they are intended to describe the presence of features, integers, steps, operations, elements, and/or components, but not to exclude the presence or addition of one or more other features, integers, steps, operations, elements, components, and/or groups. When used in the present disclosure, the term "and/or" includes any and all combinations of the listed related items.

Various embodiments of the present disclosure are described herein with reference to schematic illustrations of cross-sectional views of the structures (and intermediate structures) according to the preferred embodiments of the present disclosure. Thus, deviations from the illustrated shapes may be expected due to, e.g. manufacturing techniques and/or tolerances. Therefore, the embodiments of the present disclosure should not be limited to the specific shapes of the regions illustrated herein, but should include variations in the shapes due to, e.g. manufacturing. For example, an implanted region shown as a rectangle typically has rounded or curved features and/or an implantation gradient at the edges, rather than has a binary change from the implanted region to the non-implanted region. Similarly, a buried region formed by implantation can result in some implantation in the region between the buried region and the surface through which the implantation is performed. Therefore, the regions shown in the figures are illustrative and the shapes of the regions are not intended to represent the actual shapes of the regions of the device, and thus, the shapes of the regions are not intended to limit the scope of the present disclosure.

In order to make the present disclosure easy to understand, detailed steps and structures will be provided to explain the technical solutions of the present disclosure. In the following, various preferred embodiments of the present disclosure are described in detail. However, it should be noted that in addition to the embodiments described herein, the present disclosure may be implemented in other forms.

Figure 5:
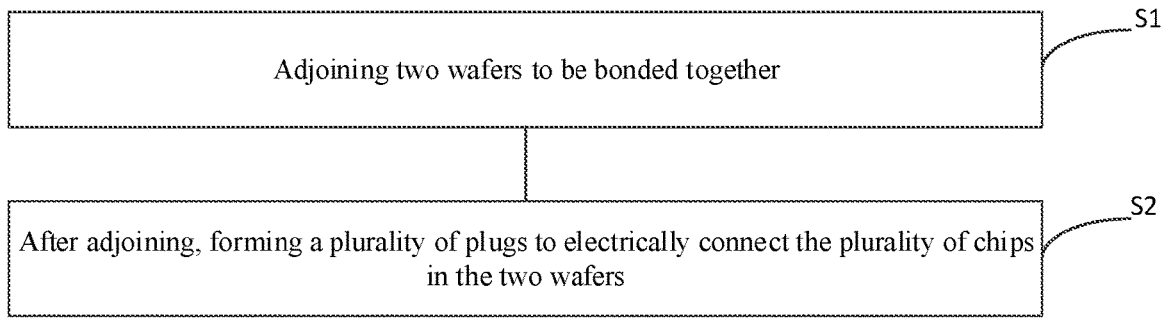
FIG. 5 illustrates a flowchart of an exemplary packaging method for wafer-level SiP according to various embodiments of the present disclosure.

In view of the significant advantages of WLP, the present disclosure provides an improved packaging method for bonding at least two wafers, each wafer containing a plurality of chips, in a stacking direction perpendicular to the surfaces of the wafers. FIG. 5 illustrates a flowchart of an exemplary packaging method for wafer-level system in package (SiP) according to various embodiments of the present disclosure. As shown in 5, the packaging method for wafer-level SiP mainly includes the following steps:

S1: adjoining two wafers to-be-bonded together; and

S2: after adjoining, forming a plurality of plugs to electrically connect the chips in the two wafers.

The packaging methods of the present disclosure complete both package fabrication on a wafer and integration of multiple chips, and thus realize the combination of the WLP and the SiP methods. According to conventional packaging methods (cutting, and then packaging and testing), after packaging, at least 20% of the volume of the original chip is added. According to the methods provided by the present disclosure, at least two wafers, each wafer containing a plurality of chips, are bonded together by bonding the wafers on top of each other along a direction perpendicular to the surfaces of the wafers. That is, a stack package of the chips may be obtained. Moreover, after the chips are completely packaged on the wafers, the bonded structure is then cut into a plurality of independent multi-chip modules. As such, the size of the original chip can be maintained, and the area of the package structure can be greatly reduced. When using a plurality of plugs to electrically connect the corresponding chips, the required circuit wires are short, which can effectively reduce current loss. Therefore, the electrical performance may be optimized. According to the methods provided by the present disclosure, manufacturing is implemented through a mass production process on the wafer level, the packaging process may be more efficient. In addition, because the manufacturing equipment for wafers can still be fully used, building a separate packaging production line may not be necessary. Therefore, the equipment requirements for packaging can be significantly reduced. The packaging methods provided by the present disclosure directly put wafers with each containing a plurality of chips into the packaging process, such that the intermediate processing steps may be greatly reduced, the manufacturing cycle may be significantly shortened, the manufacturing cost and effort may be cut down, and the packaging efficiency and yield may be improved.

Exemplary Embodiment 1

In the following, a packaging method for wafer-level SiP according to an embodiment of the present disclosure will be described in detail. The method is used to bond two wafers, each wafer containing a plurality of chips, in a stacking direction perpendicular to the surfaces of the wafers. FIGS. 1A-1E illustrate schematic cross-sectional views of structures at certain stages of the exemplary packaging method for wafer-level SiP.

Figure 6:
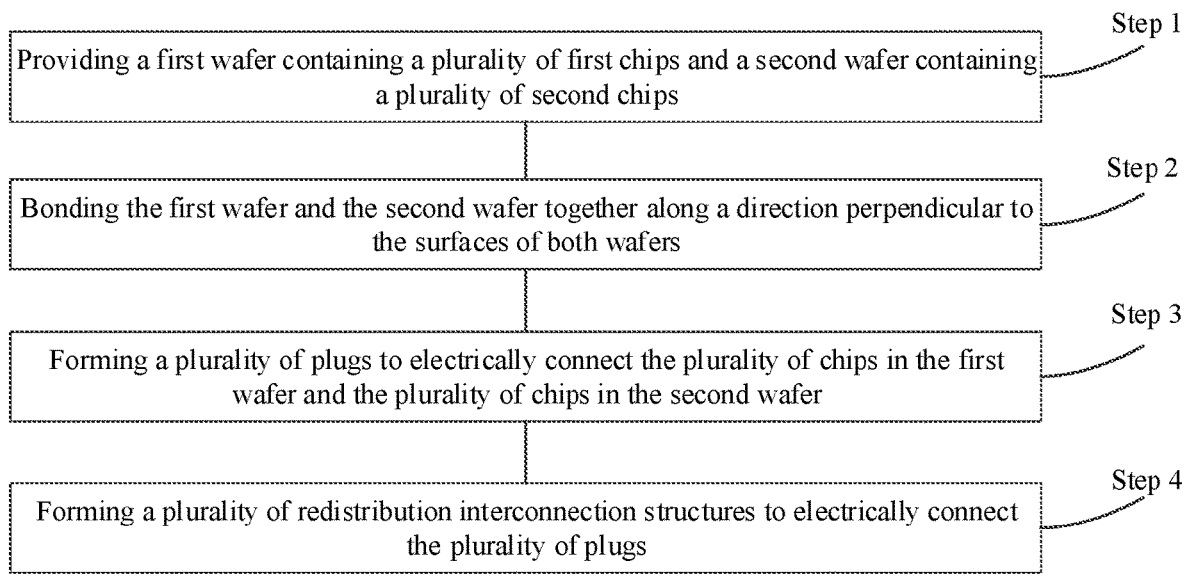
FIG. 6 illustrates a flowchart of an exemplary method for bonding two wafers, each wafer containing a plurality of chips, in a stacking direction perpendicular to the surfaces of the wafers according to various embodiments of the present disclosure.

As an example, the packaging method for wafer-level SiP provided by the present disclosure is used for bonding at least two wafers, each containing a plurality of chips, in a stacking direction perpendicular to the surfaces of the wafers. FIG. 6 illustrates a flowchart of an exemplary method for bonding two wafers with each wafer containing a plurality of chips in a stacking direction perpendicular to the surfaces of the wafers according to various embodiments of the present disclosure.

Referring FIG. 6, in Step 1, a first wafer containing a plurality of first chips and a second wafer containing a plurality of second chips may be provided. FIG. 1A illustrates a schematic cross-sectional view of a structure consistent with some embodiments of the present disclosure.

Referring to FIG. 1A, a first wafer 100 containing a plurality of first chips 101 and a second wafer 200 containing a plurality of second chips 201 may be provided. For example, a plurality of first chips 101 spaced apart from each other may be disposed inside the front side surface of the first wafer 100, and a plurality of second chips 201 spaced apart from each other may be disposed inside the front side surface of the second wafer 200.

The first wafer 100 and the second wafer 200 may both be complete device productions. The first wafer 100 and the second wafer 200 may be device wafers having a plurality the first chips 101 and a plurality of second chips 201, respectively formed thereon. The device wafers can be fabricated using an integrated circuit (IC) fabrication technique based on a corresponding layout design. For example, devices such as N-type metal-oxide-semiconductor (NMOS) devices and/or P-type metal-oxide-semiconductor (PMOS) devices, as well as structures such as interconnection layers with each composed of a dielectric layer and a metal layer, soldering pads with each formed on a corresponding interconnection layer, etc. may be formed on a semiconductor wafer through deposition, etching, and other fabrication processes. As such, a plurality of first chips 101 and a plurality of second chips 201 arranged in an array may be fabricated in the semiconductor wafers.

In one embodiment, the first wafer 100 and the second wafer 200 may each include a semiconductor substrate. The semiconductor substrate may be made of at least one of Si, Ge, SiGe, SiC, SiGeC, InAs, GaAs, InP, InGaAs, as well as other Group III/V semiconductors, and may have a single-layer or multilayer structure of these semiconductor materials. Alternatively, the semiconductor substrate may be silicon-on-insulator (SOI), stacking-silicon-on-insulator (SSOI), stacking-SiGe-on-insulator (S—SiGeOI), silicon germanium on insulator (SiGeOI), germanium on insulator (GeOI), etc.

In one embodiment, the chips involved in the present disclosure (e.g., the first chips 101, the second chips 201, and a plurality of third chips mentioned later) may be semiconductor chips of any type, including active devices, such as memory, logic circuit, power device, bipolar device, individual MOS transistor, microelectromechanical system (MEMS), as well as photovoltaic device such as light-emitting diode, etc., and passive devices such as resistor, capacitor, etc.

The chips (e.g., the first chips 101, the second chips 201, and a plurality of third chips mentioned later) may be formed on the front side surface of the corresponding wafer through a proper process well known to those skilled in the art. That is, the chips may be formed on the semiconductor substrates through a semiconductor process. For illustrative purposes, each chip in the present disclosure (e.g., the first chip 101, the second chip 201, and a third chip mentioned later) is simply shown as a box. However, it is conceivable that each chip in the present disclosure may include a plurality of constituent components, metal interconnection structures, etc. Each metal interconnection structure may include a plurality of metal layers and a plurality of contact holes electrically connecting adjacent metal layers. Adjacent chips may be separated by a dielectric layer formed on the front side surface of the wafer. As such, similar to that shown in FIG. 1A, a structure, in which each of the first chips 101 and the second chips 201 is embedded in the front side surface of the corresponding wafer, may be formed.

The dielectric layer may be a single dielectric layer or may be formed by multiple dielectric layers. In one example, the material of the dielectric layer may be any appropriate dielectric material well known to those skilled in the art, including but not limited to $SiO_2$, fluorocarbon (CF), carbon-doped silicon oxide (SiOC) or silicon carbonitride (SiCN), etc.

It should be noted that the first chips 101 and the second chips 201 may also include a plurality of chips with different structures formed in the front side surface of the corresponding wafer. The plurality of chips may have different functions.

In addition, in the present disclosure, the front side surface of a wafer refers to the surface of the wafer on which the plurality of chips are formed, and the back side surface of the wafer refers to the surface of the wafer opposite to the front side surface. In the present disclosure, without further specification, the definitions of the front side surface and the back side surface of a wafer may be referred to the above explanation.

In one embodiment, the plurality of first chips 101 and the plurality of second chips 201 may all have the same structure and the same functions.

Figure 1B:
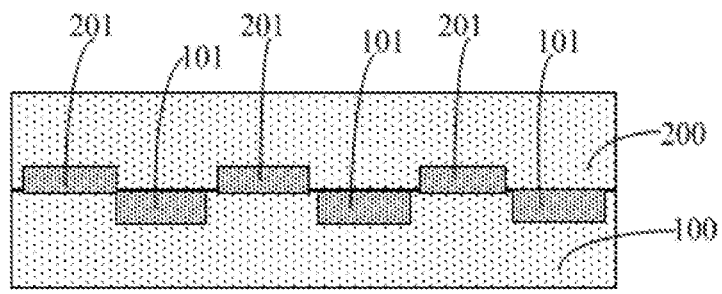
Figure 1C:
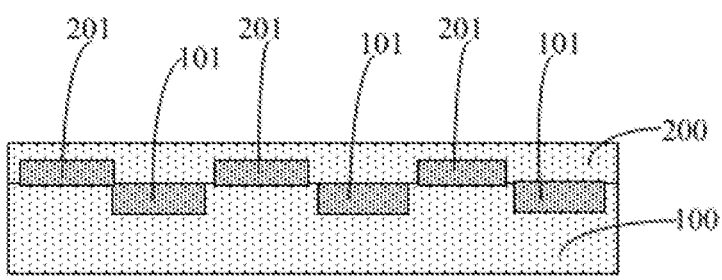

Further, referring to FIG. 6, in Step 2, the two wafers may be bonded together along a direction perpendicular to the surfaces of both wafers. FIGS. 1B and 1C illustrate schematic cross-sectional views of two structures, respectively consistent with some embodiments of the present disclosure.

In one embodiment, referring to FIG. 1B, the two wafers may be bonded together. In another embodiment, referring to FIG. 1C, prior to bonding the wafers, a thinning-down process may be selectively perform on the back side surface of one of the two wafers to-be-bonded. For example, prior to bonding the two wafers, a thinning-down process may be performed on the back side surface of the first wafer 100 or the second wafer 200 to reduce the thickness of the corresponding wafer such that a target thickness may be reached. After the thinning-down process, the first wafer 100 and the second wafer 200 may be bonded together.

In one embodiment, the target thickness of a wafer after thinning down may be, for example, in a range between 10 μm and 100 μm. The target thickness may be determined according to the actual processing node, and is not specifically defined herein.

In one embodiment, the step for thinning down one of the wafers (e.g., either the first wafer 100 or the second wafer 200) from the back side surface of the wafer may include providing a support substrate (not shown). The support substrate may be any appropriate substrate well known to those skilled in the art. For example, the support substrate may be a semiconductor substrate, a glass substrate, a ceramic substrate, etc. The step for thinning down one of the wafers from the back side surface of the wafer may include bonding the support substrate to the front side surface of the wafer to be thinned down. Bonding the support substrate to the wafer can use any appropriate bonding method, such as temporary bonding or adhesive bonding. For example, an adhesive layer may be used to bond the supporting substrate to the front side surface of the wafer to be thinned down, and the adhesive layer may be made of a material including, but not limited to, an organic polymer material or an ultraviolet-denatured organic material. Further, the step for thinning down one of the wafers from the back side surface of the wafer may include performing a thinning-down process on the back side surface of the wafer that needs to be thinned down, and finally separating the thinned wafer from the supporting substrate. An appropriate removal method may be selected based on the bonding method used. For example, through a high temperature or ultraviolet irradiation method, the adhesive layer may be denatured and lose its viscosity, and thus the support substrate may be peeled off.

In another embodiment, the first wafer 100 and the second wafer 200 may be bonded first. For example, as shown in FIG. 1B, the front side surface of the first wafer 100 and the front side surface of the second wafer 200 may be bonded together. After the bonding step, before forming a plurality of plugs, one of the wafers (either the first wafer 100 or the second wafer 200) may be thinned down from the back side surface of the wafer such that the thickness of the wafer may reach the target value after thinning.

Figure 2A:
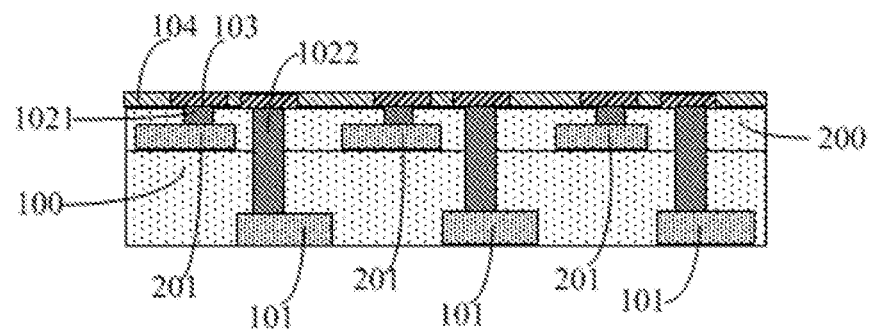
FIG. 2A illustrates a schematic cross-sectional view of a structure obtained by bonding the front side surface of one wafer to the back side surface of another wafer according to an embodiment of the present disclosure.

In another embodiment, the front side surface of one of the two wafers may be bonded to the back side surface of the other wafer. For example, as shown in FIG. 2A, the front side surface of the first wafer 100 may be bonded to the back side surface of the second wafer 200, and then a thinning-down process may be selectively performed on the back side surface of the wafer with the back side surface facing outside (e.g., the first wafer 100) to make the thickness of the wafer reach the target value after thinning.

Figure 2B:
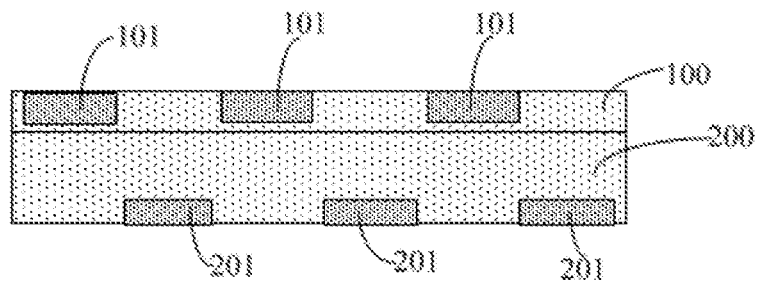
FIG. 2B illustrates a schematic cross-sectional view of a structure obtained by bonding the back side surfaces of two wafers according to an embodiment of the present disclosure.

In another embodiment, the two wafers may be bonded together with the back side surfaces facing each other. That is, the back side surface of one of the two wafers may be bonded to the back side surface of the other wafer. For example, as shown in FIG. 2B, the back side surfaces of the first wafer 100 and the second wafer 200 may be bonded together. Prior to bonding the first wafer 100 and the second wafer 200, one of the wafers (either the first wafer 100 or the second wafer 200) may be selectively thinned down from the back side surface of the wafer such that the thickness of the wafer may reach the target value after thinning.

It should be noted that in the present disclosure, thinning down the wafer (the first wafer 100, the second wafer 200, or a third wafer mentioned later, etc.) may be implemented through any appropriate thinning-down process well known to those skilled in the art. The thinning-down process may include, for example, at least one of mechanical grinding, chemical mechanical polishing (CMP), and etching. To avoid repetition, the thinning-down process will not be described again in the following embodiments.

Bonding the first wafer 100 and the second wafer 200 together may be achieved by any appropriate method, e.g., a wafer bonding method. For example, the two wafers may be bonded together through a fusion bonding process, a silicon-silicon direct bonding process, or an adhesive bonding process. Among them, the fusion bonding process, especially a low-temperature fusion bonding process, may be a preferred option for avoiding device failure due to reaching an excessively high temperature during the bonding process. In particular, the temperature during a low temperature fusion bonding process may be below 400° C., for example, the temperature of the low temperature fusion bonding process may be in a range between 100° C. and 250° C.

In one embodiment, the first wafer 100 and the second wafer 200 may also be bonded together through an adhesive bonding process. For example, the first wafer 100 may be bonded to the second wafer 200 using an adhesive layer. In one embodiment, the adhesive layer may be an organic thin film. The organic thin film may include various organic film layers, such as a die attach film (DAF), a dry film, a photoresist layer, etc. The thickness of the adhesive layer may be set according to the actual needs, and the adhesive layer may not be limited to a single layer structure, instead, the adhesive layer may include two or more than two layers.

The relative position of the plurality of second chips 201 with respect to the plurality of first chips 101 may be properly defined according to the device type and size. For example, the plurality of first chips 101 and the plurality of second chips 201 may be overlapped with each other in the direction perpendicular to the wafers, or the plurality of second chips 201 may be disposed in areas outside the plurality of first chips 101 to completely arrange the plurality of second chips 201 and the plurality of first chips 101 alternated such that a subsequent process for forming a plurality of plugs may be facilitated.

FIG. 1C illustrates a schematic cross-sectional view of a structure obtained after performing a thinning-down process on the back side surface of the first wafer 100 or the second wafer 200 following bonding the two wafers together. Referring to FIG. 1C, in order to reduce the size of the integrated device, after the first wafer 100 and the second wafer 200 are bonded together, a thinning-down process may be performed on the back side surface of the first wafer 100 or the second wafer 200. The thinning-down process may be applied to the first wafer 100 or the second wafer that is intended to form a plurality of first plugs and a plurality of second plugs in a subsequent process. For example, when the plurality of first plugs and the plurality of second plugs are intended to be formed in the second wafer 200, the second wafer 200 may be thinned down from the back side surface of the second wafer 200 to reach a target thickness, and the target thickness may be determined according to the actual process needs, and is not specifically defined herein. Alternatively, when the plurality of first plugs and the plurality of second plugs are intended to be formed in the first wafer 100, the first wafer 100 may be thinned down from the back side surface of the first wafer 100 to reach a target thickness, and the target thickness may be determined according to the actual process needs.

Figure 1D:
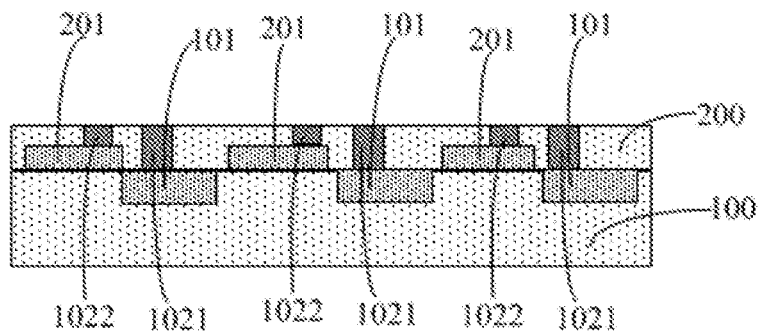

Further, referring to FIG. 6, in Step 3, a plurality of plugs may be formed to electrically connect the chips in the two wafers. FIGS. 1D and 2A illustrates schematic cross-sectional views of two structures, respectively consistent with some embodiments of the present disclosure.

Referring to FIGS. 1D and 2A, a plurality of plugs may be formed to electrically connect the chips in the two wafers.

In one embodiment, a method for forming the plurality of plugs may include forming a plurality of vias in at least one of the two wafers that are bonded together. For example, referring to FIGS. 1D and 2A, after the two wafers are bonded together, at least one of the wafers may be etched from the exposed surface of the corresponding wafer to form a plurality of vias for further forming a plurality of plugs to electrically connect the corresponding chips. The plurality of vias may be formed in any one of the two wafers. Alternatively, the plurality of vias may be formed in both wafers. That is, the two wafers may be etched from the exposed surfaces of the wafers to form a plurality of vias, and a conductive material may then be filled into the plurality of vias to form a plurality of plugs to electrically connect the corresponding chips.

In one embodiment, the plurality of plugs may be formed in the surface of either one of the two wafers that are bonded together. For example, a plurality of first plugs 1021 and a plurality of second plugs 1022 may be formed alternately in either the first wafer 100 or the second wafer 200 as shown in FIGS. 1D and 2A. Moreover, at least one first chip 101 may be electrically connected to at least one first plug 1021, and at least one second chip 201 may be electrically connected to at least one second plug 1022.

For example, the plurality of first plugs 1021 may be used to realize electrical connection between the plurality of first chips 101 and an external circuit, and the plurality of second plugs 1022 may be used to realize electrical connection between the plurality of second chips 201 and an external circuit. FIG. 1D only illustrates a case where each first chip 101 is electrically connected to one of the first plugs 1021 and each second chip 201 is electrically connected to one of the second plugs 1022; however, the present disclosure is also applicable to other cases in which each chip is electrically connected to a plurality of plugs.

The plugs (e.g., the first plugs 1021, the second plugs 1022, and a plurality of third plugs mentioned later) involved in the present disclosure may be any appropriate metal plug or through silicon via (TSV) well known to those skilled in the art. The material of the metal plug may include, but is not limited to, at least one of Ag, Au, Cu, Pd, Cr, Mo, Ti, Ta, Sn, W, and Al, and the material of the TSV may include doped polycrystalline silicon, un-doped polycrystalline silicon, etc.

The first plug 1021 and the second plug 1022 can be formed using any appropriate method known to those skilled in the art. In one example, the method for forming the first plug and the second plug may include the following exemplary steps. First, a patterned mask layer (not shown) may be formed on the back side surface of the second wafer 200. In one embodiment, the mask layer may be a photoresist mask layer, and a pattern for the plurality of first plugs and the plurality of second plugs to be formed may be predetermined in the patterned photoresist mask. Then, using the patterned mask layer as an etch mask, a portion of the second wafer 200 may be etched until partially exposing the first chips to form the plurality of first vias; simultaneously, another portion of the second wafer 200 may be etched until partially exposing the second chips to form the plurality of second vias. The etching process may be a wet etching or a dry etching process. In one embodiment, a dry etching process is adopted. Subsequently, the patterned mask layer may be removed. For example, a photoresist mask layer may be removed using an ashing method. Finally, a conductive material (such as a metal or polycrystalline silicon) may be formed to fill the plurality of first vias and the plurality of second vias to form the plurality of first plugs and the plurality of second plugs. The conductive material may be deposited through a physical vapor deposition (PVD) process, a chemical vapor deposition (CVD) process, an electrolytic plating process, an electroless plating process, or any other appropriate metal deposition process.

In one embodiment, each first plug 1021 may extend from the back side surface of the second wafer 200 toward the front side surface to electrically connect the corresponding first chip 101, and each second plug 1022 may extend from the back side surface of the second wafer 200 toward the front side surface to electrically connect the corresponding second chip 201.

In the present disclosure, forming the plurality of first plugs 1021 and the plurality of second plugs 1022 in the second wafer 200 is mainly provided as an example for illustration. It is conceivable that in some other embodiments of the present disclosure, a similar method may be adopted to form a plurality of first plugs 1021 and a plurality of second plugs 1022 in the first wafer 100.

In one embodiment, when the formed plugs have different depths, a multi-time photolithography process may be performed to form the plurality of plugs. The multi-time photolithography process may include: forming a first patterned mask layer on one of the wafers to define the positions of the plurality of first plugs; etching the corresponding wafer by using the first patterned mask layer as an etch mask to form a plurality of first vias with each having a first depth; removing the first patterned mask layer; forming a second patterned mask layer on the surface of the wafer on which the plurality of first vias are formed to define the positions of the plurality of second plugs; etching the wafer by using the second patterned mask layer as an etch mask to form a plurality of second vias with each having a second depth; removing the second patterned mask layer; and filling the plurality of first vias and the plurality of second vias with a conductive material to form the plurality of first plugs and the plurality of second plugs. The dimensions of the first depth and the second depth may be properly selected according to actual processes.

In another embodiment, a plurality of plugs may be formed in each of the two wafers that are bonded together. For example, the steps for forming a plurality of plugs may include: forming a first patterned mask layer on one of the wafers (e.g., the first wafer) to define the positions of the plurality of first plugs; etching the wafer (e.g., the first wafer) by using the first patterned mask layer as an etch mask to form a plurality of first vias; removing the first patterned mask layer; filling the plurality of first vias with a conductive material to form the plurality of first plugs to electrically connect the corresponding chips, which may be the plurality of first chips formed on the first wafer or the plurality of second chips formed on the second wafer; forming a second patterned mask layer on the other wafer (e.g., the second wafer) to define the positions of the plurality of second plugs; etching the wafer (e.g., the second wafer) using the second patterned mask layer as an etch mask to form a plurality of second vias; removing the second patterned mask layer; and filling the plurality of second vias with a conductive material to form the plurality of second plugs to electrically connect the corresponding chips.

In one embodiment, the plurality of plugs may be formed above the corresponding chips. For example, as shown in FIG. 1D, each first plug 1021 may be formed over the corresponding first chip 101, and each second plug 1022 may be formed over the corresponding second chip 201.

In one embodiment, the plurality of plugs may be formed on one side of the corresponding chips, and prior to forming the plurality of plugs, the method may further include forming a plurality of interconnection wires (not shown) to electrically connect the corresponding chips. After subsequently forming the plurality of plugs on the same side of the corresponding chips, the plurality of interconnection wires may also electrically connect to the plurality of plugs. That is, each chip and the corresponding plug may be connected by an interconnection wire. The method for forming the plurality of interconnection wires may be any appropriate method that is known to those skilled in the art, and thus will not be described in detail herein. Each interconnection wire may include a plurality of metal layers as well as a contact hole that connects adjacent metal layers. The interconnection wires may be made of any appropriate conductive material, such as a metal, including but not limited to copper or aluminum.

Figure 1E:
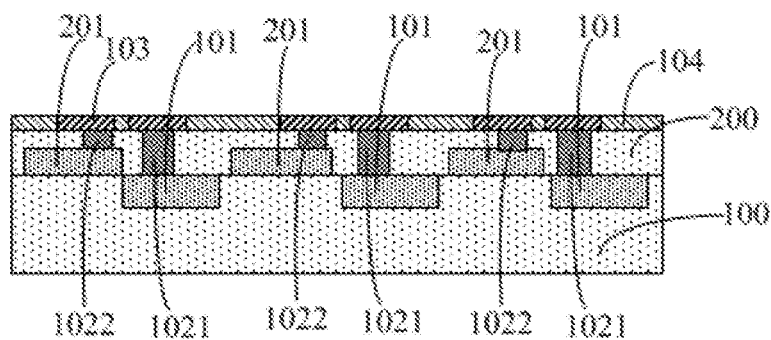

Further, referring to FIG. 6, in Step 4, a plurality of redistribution interconnection structures may be formed to electrically connect the plurality of plugs. FIG. 1E illustrates a schematic cross-sectional view of a structure consistent with some embodiments of the present disclosure.

Referring to FIG. 1E, after forming the plurality of first plugs 1021 and the plurality of second plugs 1022, a plurality of first redistribution interconnection structures 103 may be formed on the same surface of the first wafer 100 or the second wafer 200 as the plurality of first plugs 1021 and the plurality of second plugs 1022 are formed on. The plurality of first redistribution interconnection structures 103 may be spaced apart from each other and each first redistribution interconnection structure 103 may be electrically connected to at least one first plug 1021 and/or at least one second plug 1022.

The redistribution interconnection structure (e.g., the first redistribution interconnection structure and a second redistribution interconnection structure mentioned later) may be made of any appropriate metal, including, but not limited to, at least one of Ag, Au, Cu, Pd, Cr, Mo, Ti, Ta, Sn, W, and Al.

In one embodiment, the first redistribution interconnection structure 103 may include a rewiring layer and a soldering pad, or may only include a soldering pad.

The plurality of first redistribution interconnection structures 103 may be formed using any appropriate method. For example, the plurality of first redistribution interconnection structures 103 may be formed by a method including the following exemplary steps. First, a metal material layer may be formed to cover the back side surface of the second wafer 200. The metal material layer may be formed through a PVD process, a CVD process, an electrolytic plating process, an electroless plating process, or any other appropriate metal deposition process. Then, a portion of the metal material layer may be removed through an etching process to form the plurality of first redistribution interconnection structures 103 that are spaced apart from each other.

Although each first redistribution interconnection structure 103 shown in FIG. 1E is only electrically connected to a corresponding plug, it is conceivable that in order to implement other electrical connection methods, a first redistribution interconnection structure 103 may be electrically connected to at least one first plug 1021 and at least one second plug 1022.

It should be noted that a plurality of metal interconnection wires may also be formed over the plurality of first redistribution interconnection structures 103 to implement connections for more chips. Typically, the metal interconnection wires may include more metal layers located in different layers, in which the metal layers in different layers are electrically connected to each other through polycrystalline-silicon plugs or metal plugs disposed between adjacent layers.

In one embodiment, after forming the plurality of first redistribution interconnection structures 103, the method may further include the following steps. An interlayer dielectric layer 104 may be formed to cover the plurality of first redistribution interconnection structures 103 and the back side surface of the first wafer 100 or the second wafer 200. For example, the interlayer dielectric layer 104 may be formed to cover the plurality of first redistribution interconnection structures 103 and the back side surface of the second wafer 200.

The interlayer dielectric layer 104 may be made of, for example, $SiO_2$, fluorocarbon (CF), carbon-doped silicon oxide (SiOC), silicon carbonitride (SiCN), etc. Alternatively, a film structure, for example, a SiCN film formed on fluorocarbon (CF) may be used as the interlayer dielectric layer 104. Fluorocarbon is mainly composed of fluorine (F) and carbon (C), and may be a material having an amorphous (non-crystalline) structure. Moreover, a porous structure such as carbon-doped silicon oxide (SiOC) can also be used as the interlayer dielectric layer 104.

The inter layer dielectric layer 104 may be formed by a CVD method, a PVD method, an atomic layer deposition (ALD) method, or any other appropriate deposition method.

The top surface of the interlayer dielectric layer 104 may be leveled with the top surfaces of the plurality of first redistribution interconnection structures 103. Alternatively, the top surface of the interlayer dielectric layer 104 may be above the top surfaces of the plurality of first redistribution interconnection structures 103.

In one embodiment, a planarization process may be selectively performed on the top surfaces of the interlayer dielectric layer 104 and the plurality of first redistribution interconnection structures 103. The planarization process may be performed using a CMP method or using any other appropriate method.

As such, the introduction of the key steps of the methods for bonding two wafers according to various embodiments of the present disclosure is completed. A complete method may also include other steps. In one example, after the packaging process is completed, the bonded wafers may be cut along a plurality of scribed lines such that the plurality of chips integrated on the wafers may be separated into individual units. For example, each unit may include at least one first chip and at least one second chip, and the unit may form a system or a subsystem that provides multiple functions, which may depend on the functionalities of the actual integrated chip.

Exemplary Embodiment 2

The steps described above are the main processing steps required to bond two wafers that have a plurality of chips formed in each wafer (e.g. a first wafer and a second wafer). Using the method provided in the present disclosure may be able to integrate more wafers, and thus implement a packaging process for more chips. The packaging method provided by the present disclosure may also be used to bond at least three wafers, each wafer containing a plurality of chips, in a stacking direction perpendicular to the surfaces of the wafers.

In the following, a packaging method in which at least three wafers, each wafer containing a plurality of chips, are bonded together in a stacking direction perpendicular to the surfaces of the wafers will be described with reference to FIGS. 1A-1E, 2A, 3A-3C, and 4A-4B.

Figure 3A:
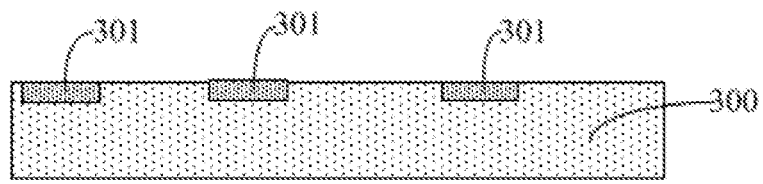
FIGS. 3A-3C illustrate schematic cross-sectional views of structures at certain stages of an exemplary packaging method for further bonding a third wafer containing a plurality of chips to two bonded wafers in a stacking direction perpendicular to the surfaces of the wafers according to an embodiment of the present disclosure.

First, after bonding the two wafers that have a plurality of chips formed in each wafer together as described in the embodiments provided above, as shown in FIG. 3A, a third wafer 300 may be provided. In one embodiment, at least one third wafer 300 that contains a plurality of third chips 301 may be provided. The plurality of third chips 301, spaced apart from each other, may be formed in the front side surface of each third wafer 300.

The third wafer may be a complete device production, and may be a device wafer having a plurality of third chips formed thereon.

The device wafer can be fabricated using an IC fabrication technique based on a corresponding layout design. For example, devices such as NMOS devices and/or PMOS devices, as well as structures such as interconnection layers with each composed of a dielectric layer and a metal layer, soldering pads with each formed on a corresponding interconnection layer, etc. may be formed on a semiconductor wafer through deposition, etching, and other fabrication processes. As such, a plurality of third chips 301 arranged in an array may be fabricated in the semiconductor wafer.

In one embodiment, the third wafer may include a semiconductor substrate. The semiconductor substrate may be made of one or more of semiconductor materials that are suitable for the first wafer and the second wafer as described in the embodiments provided above.

The plurality of third chips 301 may be formed in the front side surface of the third wafer 300 through a proper process well known to those skilled in the art. As such, similar to that shown in FIG. 3A, a structure in which each of the third chips 301 is embedded in the front side surface of the third wafer 300 may be formed.

It should be noted that the third chips 301 may also be a plurality of chips with different structures formed in the front side surface of the third wafer 300.

In other embodiments, the plurality of third chips 301 may all have the same structure and the same functions.

Then, the new wafer may be further bonded to one of the two wafers that have already been bonded together. That is, in the present step, one of the two wafers to-be-bonded together may be the new wafer; and the other may be one of the two wafers that have already been bonded together.

Figure 3B:
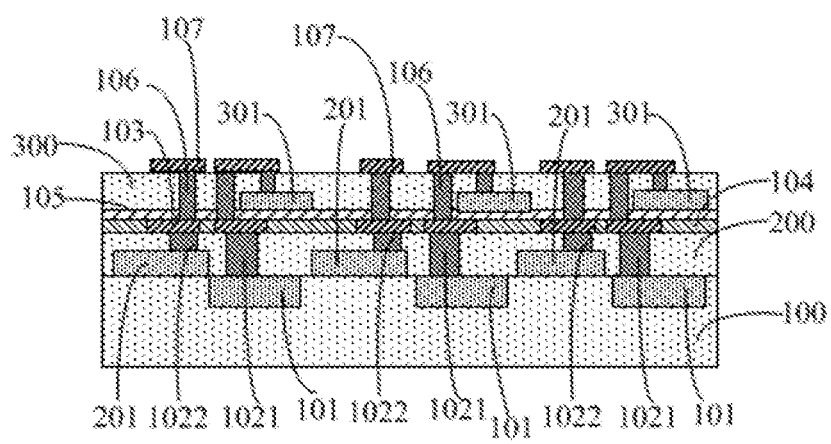

In one embodiment, the new wafer may refer to a wafer to be further bonded to a plurality of bonded wafers. For example, as shown in FIG. 3B, the new wafer may refer to a third wafer 300, and the third wafer 300 may need to-be-bonded to one of the two wafers (either the first wafer 100 or the second wafer 200) that have been bonded together (FIG. 1E shows an example of the bonded structure).

Figure 7:
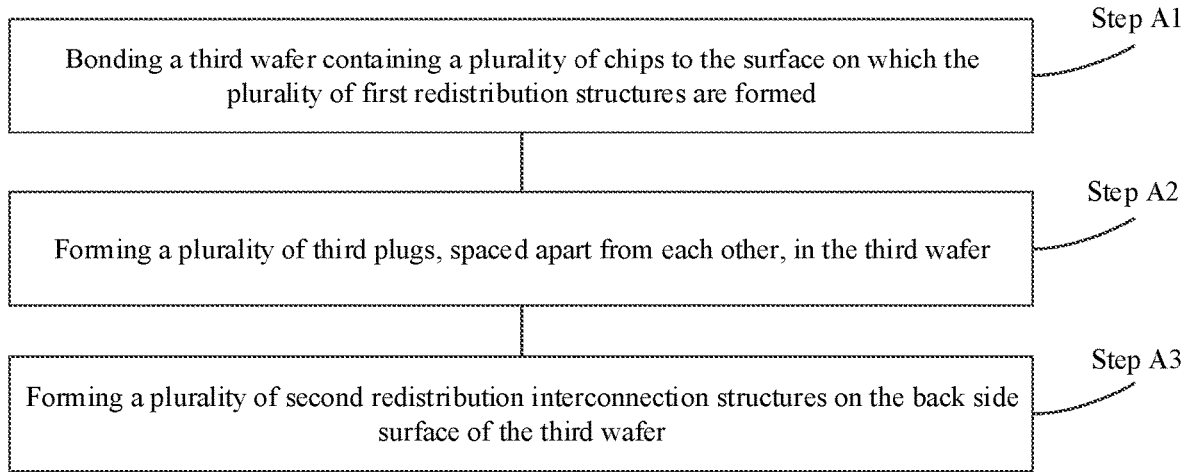
FIG. 7 illustrates a flowchart of an exemplary method for bonding a third wafer that contains a plurality of chips to one of the two bonded wafers in a stacking direction perpendicular to the surfaces of the wafers according to various embodiments of the present disclosure.

In the present disclosure, a method for bonding one of the third wafers 300 to the second wafer 200 of the two wafers that have been bonded together as shown in FIG. 1E is described as an example for illustration. The method is equally applicable to the case where the wafer 300 is bonded to the first wafer 100 of the two wafers that have been bonded together as shown in FIG. 1E. FIG. 7 illustrates a flowchart of an exemplary method for bonding a third wafer that contains a plurality of chips to one of two bonded wafers in a stacking direction perpendicular to the surfaces of the wafers according to various embodiments of the present disclosure. Referring to FIG. 7, the method for bonding a third wafer 300 to one of the two bonded wafers may mainly include the following steps.

In Step A1, a third wafer 300 containing a plurality of chips may be bonded to the surface on which the plurality of first redistribution interconnection structures 103 are formed. The bonding process may be implemented by any appropriate bonding method described above for bonding the first wafer and the second wafer.

In one embodiment, in order to implement a fusion bonding process, prior to bonding the wafers, the method may also include forming a bonding layer 105 on the front side surface of the third wafer 300.

The bonding layer 105 may include a $SiO_2$ layer. The $SiO_2$ layer may be a layer of $SiO_2$ formed by a thermal CVD process, a high density plasma (HDP) process, or a tetraethyl orthosilicate (TEOS) process, or may be formed by thermal oxidation. Alternatively, the $SiO_2$ layer may be formed by a low temperature oxidation (LTO) process with a process temperature below 200° C.

In one embodiment, when performing the bonding process, the bonding layer 105 may be bonded to the interlayer dielectric layer 104 to implement the bonding between the third wafer 300 and the second wafer.

In one embodiment, the bonding process may be a fusion bonding process, especially, a low-temperature fusion bonding process may be a preferred option. During the bonding process, pressure may also be applied. For example, a bonding pressure in a range of ~1 N to ~10 N may be applied. The bonding time may be in a range of ~10 s to ~60 s. During the bonding process, Si—O bonds may be formed to realize the bonding between the two wafers.

In one embodiment, after the third wafer 300 is bonded, the third wafer 300 may be thinned down from the back side surface of the third wafer 300 to reach a target thickness. The target thickness may be determined according to the actual process needs, and is not specifically defined herein.

Further, in Step A2, a plurality of third plugs 106, spaced apart from each other, may be formed in the third wafer 300. Some of the third plugs 106 may be electrically connected to the first redistribution interconnection structures 103, and some of the third plugs 106 may be electrically connected to the plurality of third chips 301.

Each third plug 106 may extend from the back side surface of the third wafer 300 toward the front side surface. Each first redistribution interconnection structure 103 may be electrically connected to at least one third plug 106, and each third chip 301 may be electrically connected to at least one third plug 106. The third plugs 106 that are electrically connected to the plurality of first redistribution interconnection structures 103 may be formed through the third wafer 300 and the bonding layer 105.

It should be noted that the plurality of third plugs 106 may be formed by any appropriate method. For example, the plurality of third plugs 106 may be formed by referring to the method for forming the plurality of first plugs and the plurality of second plugs as disclosed in an embodiment provided above.

Further, in Step A3, a plurality of second redistribution interconnection structures 107 may be formed on the back side surface of the third wafer 300.

For example, the second redistribution interconnection structure 107 may include a rewiring layer and a soldering pad, or may only include a soldering pad. The second redistribution interconnection structure 107 may be used to connect the first chip, the second chip, and the third chip to external circuits. The plurality of second redistribution interconnection structures 107 may be electrically connected to the plurality of third plugs 106.

The plurality of second redistribution interconnection structures 107 may be formed by any appropriate method. The details of the method for forming the plurality of second redistribution interconnection structures 107 may refer to the corresponding description of the method for forming the plurality of first redistribution interconnection structures 103.

Figure 8:
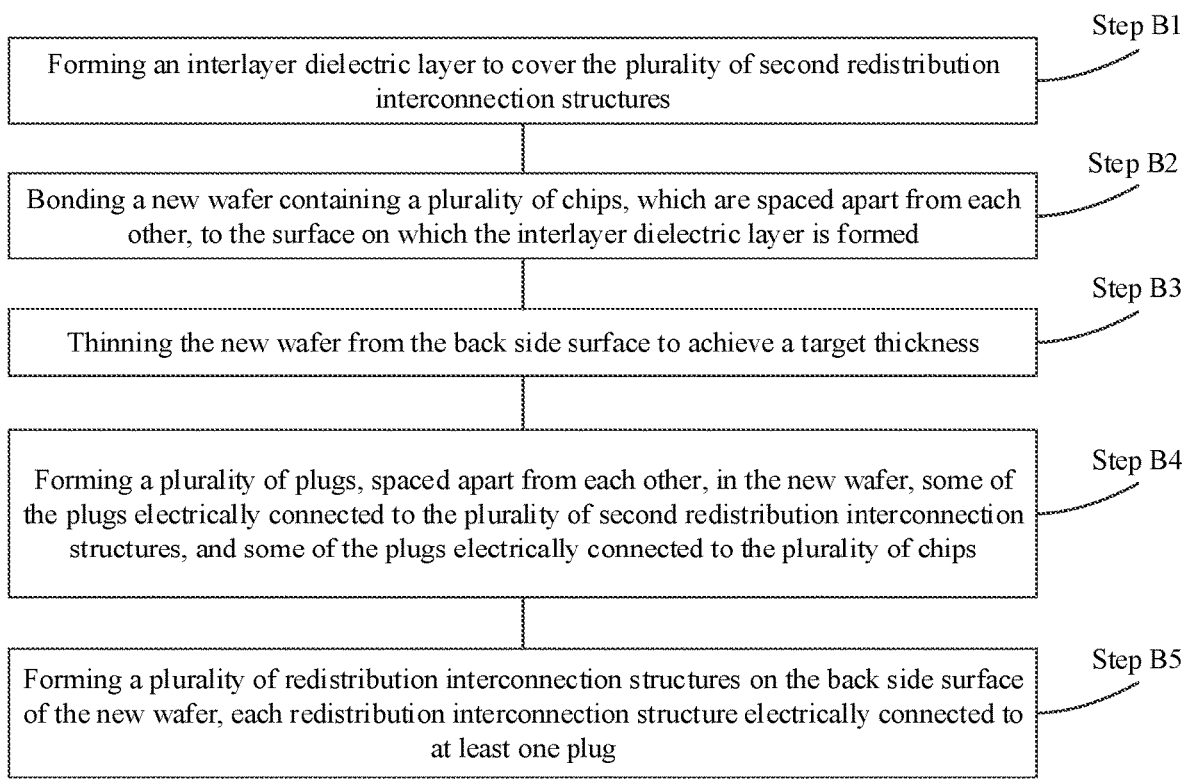
FIG. 8 illustrates a flowchart of an exemplary method for bonding a new wafer that contains a plurality of chips to one of a plurality of bonded wafers in a stacking direction perpendicular to the surfaces of the wafers according to various embodiments of the present disclosure.

In one embodiment, the packaging method may further include continually bonding a plurality of wafers on the back side surface of the third wafer. The plurality of wafers may each contain a plurality of chips, and the plurality of chips in each wafer may be spaced apart from each other. FIG. 8 illustrates a flowchart of an exemplary method for bonding a new wafer that contains a plurality of chips to one of a plurality of bonded wafers in a stacking direction perpendicular to the surfaces of the wafers according to various embodiments of the present disclosure.

Referring to FIG. 8, the packaging method may include the following exemplary steps. In Step B1, an interlayer dielectric layer may be formed to cover the plurality of second redistribution interconnection structures. In Step B2, a new wafer containing a plurality of chips that are spaced apart from each other may be bonded to the surface on which the interlayer dielectric layer is formed. In one example, a bonding layer may be formed on the front side surface of the new wafer, and then through a bonding process, the new wafer may be bonded to the surface on which the interlayer dielectric layer is formed to implement multi-wafer packaging. In Step B3, the new wafer may be thinned down from the back side surface to achieve a target thickness. Further, in Step B4, a plurality of plugs, spaced apart from each other, may be formed in the new wafer. Some of the plugs may be electrically connected to the second redistribution interconnection structures, and some of the plugs may be electrically connected to the chips formed in the new wafer. In Step B5, a plurality of redistribution interconnection structures may be formed on the back side surface of the new wafer. Each redistribution interconnection structure may be electrically connected to at least one plug. Further, Steps B1 through B5 can be sequentially cycled to achieve bonding and packaging of more than three wafers. The new wafer may always refer to the wafer to-be-bonded to the plurality of wafers that have already been bonded.

Figure 3C:
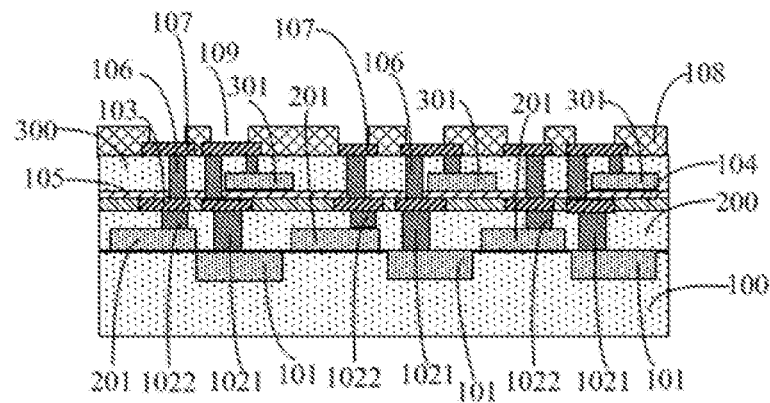

In one embodiment, as shown in FIG. 3C, a passivation layer 108 may be formed to cover the plurality of second redistribution interconnection structures 107 and the back side surface of the third wafer 300.

The passivation layer 108 may be made of any appropriate insulating material. In one embodiment, the passivation layer 108 may be an inorganic insulating layer, such as a silicon oxide layer, a silicon nitride layer, or a silicon oxynitride layer, and the passivation layer 108 may be deposited by a deposition method, such as CVD, PVD, or ALD. In other embodiments, the passivation layer 108 may be an insulating layer such as a layer containing polyvinylphenol, polyimide, or siloxane, etc. The layer containing polyvinylphenol, polyimide, or siloxane may be effectively formed using a droplet discharge method, a printing method, or a spin coating method. According to their structure, siloxane can be classified into silica glass, alkylsiloxane polymer, alkylsilsesquioxane polymer, silsesquioxane hydride polymer, alkylsilsesquioxane hydride polymer, etc. Further, the insulating material may be formed from a material including Si—N bond-containing polymer (e.g. polysilazane). Further, films formed by the insulating materials described above may be stacked together to form the passivation layer 108, that is, the passivation layer 108 may include a plurality of laminated insulating films.

In one embodiment, the top surface of the passivation layer 108 may be higher than the top surfaces of the plurality of second redistribution interconnection structures 107. The passivation layer 108 may have any appropriate thickness according to the actual requirements, and is not specifically defined herein.

In one embodiment, after forming the passivation layer 108, a CM' process may be selectively performed on the passivation layer 108 to obtain a flat surface.

In one embodiment, when packaging more than three wafers together, the passivation layer 108 may be formed to cover the redistribution interconnection structures that are formed on the top (such a redistribution interconnection structure includes a soldering pad).

Further, as shown in FIG. 3C, an opening 109 may be formed in the passivation layer 108 above each second redistribution interconnection structure 107. The opening 109 may expose a portion of the corresponding second redistribution interconnection structure 107. For example, the opening 109 may expose the soldering pad of the corresponding second redistribution interconnection structure 107.

In order to connect each soldering pad to an external circuitry, it is desirable to form the opening 109 to expose the surface of the soldering pad. The opening 109 may be formed using any appropriate method. In one example, first, a patterned mask layer, such as a photoresist layer, may be formed on the surface of the passivation layer 108 to define the pattern of the plurality openings 109. The exposed passivation layer 108 may then be etched using the patterned mask layer as an etch mask until the surfaces of the plurality of second redistribution interconnection structures are exposed, and thus, an opening 109 may be formed above each second redistribution interconnection structure 107. Further, the patterned mask layer may be removed. For example, an ashing method or a wet etching method may be used to remove the patterned mask layer that is made of a photoresist material.

Figure 4A:
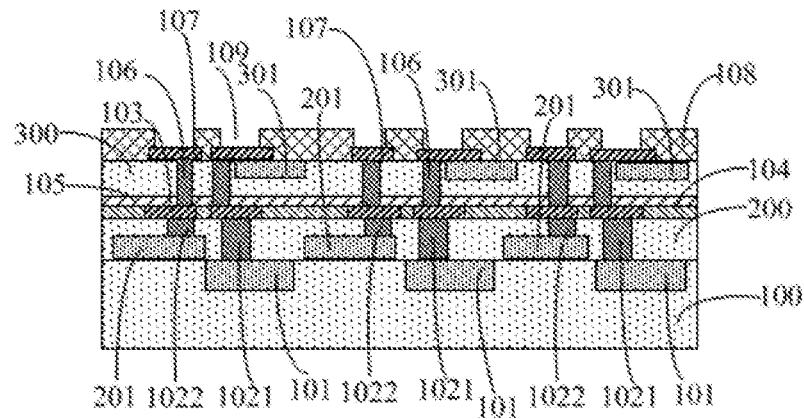
FIG. 4A illustrates a schematic cross-sectional view of a structure obtained by bonding three wafers, each wafer containing a plurality of chips, in a stacking direction perpendicular to the surfaces of the wafers according to another embodiment of the present disclosure.

In one embodiment, as shown in FIG. 4A, after the third wafer 300 is thinned down from the back side surface, the back side surface of the third wafer 300 may then be bonded to the second wafer 200. Alternatively, after the third wafer 300 is thinned down from the back side surface, the back side surface of the third wafer 300 may then be bonded to the first wafer 100. The bonding method may be the same as the bonding method described above, and the method for forming the plugs may also use the same method for forming the plugs described above. The details of the methods are not described here again.

Figure 4B:
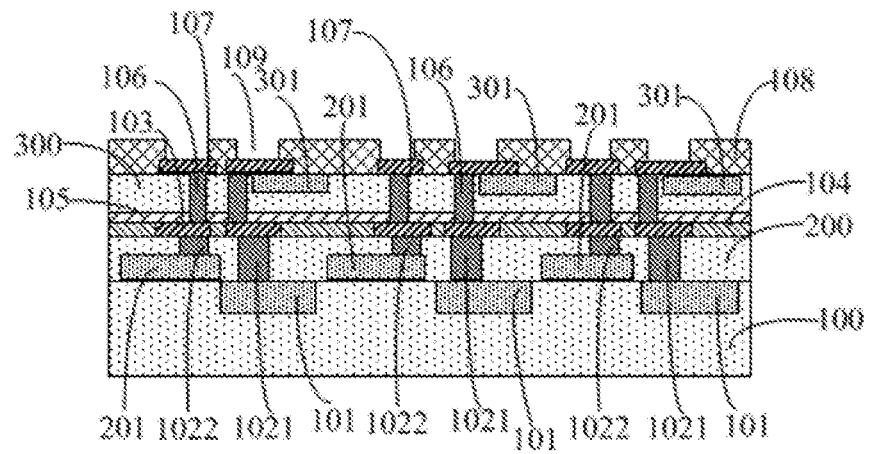
FIG. 4B illustrates a schematic cross-sectional view of a structure obtained by bonding three wafers, each wafer containing a plurality of chips, in a stacking direction perpendicular to the surfaces of the wafers according to another embodiment of the present disclosure.

In one embodiment, as shown in FIG. 4B, the structure shown in FIG. 2A may be bonded to the third wafer 300. The bonding method may be the same as the bonding method described above, and the method for forming plugs may also use the same method for forming the plugs described above. The details of the methods are not described here again.

As such, the introduction of the key steps of the methods for bonding two wafers according to various embodiments of the present disclosure is completed. A complete method may also include other steps. In one example, after the packaging process is completed, the bonded wafers may be cut along a plurality of scribed lines such that the plurality of chips integrated on the wafers may be separated into individual units. For example, each unit may include at least one first chip, at least one second chip, and at least one third chip, and the unit may form a system or a subsystem that provides multiple functions, which may depend on the functionalities of the actual integrated chip.

In summary, the packaging methods for wafer-level SiP according to the present disclosure combine WLP and SiP together to simultaneously implement the integration of multiple chips and the package manufacturing on the wafer. The methods demonstrate advantages of greatly reducing the area size of the package structure, reducing the manufacturing cost, optimizing the electronic performance, batch manufacturing, etc. Therefore, the disclosed wafer-level system packaging methods can significantly reduce the workload and equipment requirements, and improve the efficiency and yield of the package.

Exemplary Embodiment 3

The present disclosure also provides a wafer-level SiP structure manufactured by a packaging method consistent with the embodiments described above.

In the following, the package structure of the present disclosure will be explained and illustrated in detail with reference to FIGS. 1E, 3C, 4A, and 4B.

In one example, the package structure of the present disclosure may include at least two wafers, each wafer containing a plurality of chips, bonded together in a direction perpendicular to the surfaces of the wafers. For example, as shown in FIGS. 3C, 4A, and 4B, the package structure may include a first wafer 100, a second wafer 200, and a third wafer 300. A plurality of first chips 101, spaced apart from each other, may be formed on the front side surface of the first wafer 100; a plurality of second chips 201, spaced apart from each other, may be formed on the front side surface of the second wafer 200; and a plurality of third chips 301, spaced apart from each other, may be formed on the front side surface of the third wafer 300.

In one embodiment, for two wafers that are bonded to each other, one of which may have a front side surface bonded to the front side surface of the other. For example, as shown in FIGS. 1E and 3C, the front side surface of the first wafer 100 may be bonded to the front side surface of the second wafer 200.

In another embodiment, for two wafers that are bonded to each other, one of which may have a front side surface bonded to the back side surface of the other. For example, the front side surface of the first wafer may be bonded to the back side surface of the second wafer, or, as shown in FIG. 2A, the back side surface of the first wafer 100 may be bonded to the front side surface of the second wafer 200.

In another embodiment, for two wafers that are bonded to each other, one of which may have a back side surface bonded to the back side surface of the other. For example, as shown in FIG. 2B, the back side surface of the first wafer 100 may be bonded to the back side surface of the second wafer 200.

In one embodiment, the package structure of the present disclosure may further include a plurality of plugs. The chips in the two wafers that are bonded to each other may be electrically connected to the plurality of plugs. As shown in FIG. 3C, the first wafer 100 may be bonded to the second wafer 200, a plurality of first plugs 1021 may be electrically connected to the plurality of first chip 101 in the first wafer 100, and a plurality of second plugs 1022 may be electrically connected to the plurality of second chips 201 in the second wafer 200. In addition, a plurality of third plugs 106 may be electrically connected to the plurality of third chip 301 in the third wafer 300, and further, the plurality of third plugs 106 may be electrically connected to the plurality of second chips 201. Also, the plurality of third plugs 106 may further be electrically connected to the plurality of first chips 101.

In one embodiment, each plug may be formed above a corresponding chip. For example, a plurality of first plugs 1021 and a plurality of second plugs 1022 may be formed in the second wafer 200 with each first plug 1021 formed above a corresponding first chip 101 and each second plug 1022 formed above a corresponding second chip 201.

In one embodiment, each first plug 1021 may be used to electrically connect the corresponding first chip 101 to an external circuit, and each second plug 1022 may be used to electrically connect the corresponding second chip 201 to an external circuit. FIG. 3C only illustrates a case where each first chip 101 is electrically connected to one of the first plugs 1021 and each second chip 201 is electrically connected to one of the second plugs 1022; however, the present disclosure is also applicable to other cases in which each chip is electrically connected to a plurality of plugs.

In one embodiment, as shown in FIG. 1E, each first plug 1021 may extend from the back side surface of the second wafer 200 toward the front side surface to electrically connect the corresponding first chip 101, and each second plug 1022 may extend from the back side surface of the second wafer 200 toward the front side surface to electrically connect the corresponding second chip 201.

In one embodiment, the plurality of plugs may be formed on one side of the corresponding chips, and a plurality of interconnection wires (not shown) may also be formed on the same side of the corresponding chips. The plurality of interconnection wires may be electrically connected to the corresponding chips, and may also be electrically connected to the plurality of plugs that are formed on the same side of the corresponding chips. That is, each chip and the corresponding plug may be connected by an interconnection wire. Each interconnection wire may include a plurality of metal layers as well as a contact hole that connects adjacent metal layers. The interconnection wires may be made of any appropriate conductive material, such as a metal, including but not limited to copper or aluminum.

In one embodiment, the package structure may also include a plurality of redistribution interconnection structures to electrically connect to the plurality of plugs. Each redistribution interconnection structure may be formed on the top of the corresponding plugs. For example, a plurality of first redistribution interconnection structures 103 may be formed on the top of the plurality of first plugs 1021 and the plurality of second plugs 1022. Each first redistribution interconnection structure 103 may be electrically connected to at least one first plug 1021 and/or at least one second plug 1022.

Although each first redistribution interconnection structure 103 shown in FIG. 3C is only electrically connected to a corresponding plug, it is conceivable that in order to implement other electrical connection methods, a first redistribution interconnection structure 103 may be electrically connected to at least one first plug 1021 and at least one second plug 1022.

In one embodiment, the first redistribution interconnection structure 103 may include a rewiring layer and a soldering pad, or may only include a soldering pad.

In one embodiment, the package structure may also include an interlayer dielectric layer 104 covering the plurality of first redistribution interconnection structures 103 and the back side surface of the first wafer 100 or the second wafer 200. For example, the interlayer dielectric layer 104 may cover the plurality of the first redistribution interconnection structures 103 and the back side surface of the second wafer 200.

The top surface of the interlayer dielectric layer 104 may be leveled with the top surfaces of the plurality of first redistribution interconnection structures 103. Alternatively, the top surface of the interlayer dielectric layer 104 may be above the top surfaces of the plurality of first redistribution interconnection structures 103.

In one embodiment, the package structure may also include a third wafer 300 containing a plurality of third chips 301. The third wafer 300 may be bonded to the surface on which the plurality of redistribution interconnection structures 103 are formed. For example, the third wafer 300 may be bonded to the back side surface of the second wafer 200.

In one embodiment, the package structure may further include a bonding layer 105 formed at the interface between two wafers that are bonded together.

In one embodiment, the bonding layer and the interlayer dielectric layer 104 may be bonded together to realize the bonding between the third wafer 300 and the second wafer 200.

In one embodiment, the package structure may include a plurality of third plugs 106, spaced apart from each other and formed in the third wafer 300. Some of the third plugs 106 may be electrically connected to the plurality of first redistribution interconnection structures 103, and some of the third plugs 106 may be electrically connected to the plurality of third chips 301.

Each third plug 106 may extend from the back side surface of the third wafer 300 toward the front side surface. Each first redistribution interconnection structure 103 may be electrically connected to at least one third plug 106, and each third chip 301 may be electrically connected to at least one third plug 106. The plurality of third plugs 106 that are electrically connected to the plurality of first redistribution interconnection structures 103 may be formed through the third wafer 300 and the bonding layer 105.

In one embodiment, the package structure may include a plurality of second redistribution interconnection structures 107 formed on the back side surface of the third wafer 300. The second redistribution interconnection structure 107 may include a rewiring layer and a soldering pad, or may only include a soldering pad. The second redistribution interconnection structure 107 may be used to connect the first chip, the second chip, and the third chip to external circuits.

In one embodiment, the package structure may further include a passivation layer covering the surface of a wafer, on which the plurality of redistribution interconnection structures are formed. For example, as shown in FIG. 3C, the package structure may include a passivation layer 108 covering the plurality of second redistribution interconnection structures 107 and the back side surface of the third wafer 300.

In one embodiment, when more than three wafers are packaged together, the passivation layer 108 may be formed to cover the redistribution interconnection structures that are formed on the top (such a redistribution interconnection structure includes a soldering pad).

In one embodiment, the package structure may include an opening 109 formed in the passivation layer 108 above each second redistribution interconnection structure 107. The opening 109 may expose a portion of the corresponding second redistribution interconnection structure 107.

The wafer-level SiP structure provided by the present disclosure may have better performance due to the use of the packaging methods for wafer-level SiP described above.

The details of the present disclosure have been described through the embodiments provided above. However, it should be understood that the above embodiments are only for the purpose of illustration and description. Further, those skilled in the art can understand that the present disclosure is not limited to the above embodiments, and various modifications and changes can be made according to the principles of the present disclosure. These modifications and modifications are all in the scope of the present disclosure. The scope of the present disclosure is defined by the appended claims and their equivalents.

What is claimed is:

1. A packaging method for wafer-level system in package (SiP), comprising:
    bonding at least two wafers together along a stacking direction perpendicular to surfaces of the at least two wafers, each wafer containing a plurality of chips, the bonding comprising:
        adjoining two wafers of the at least two wafers to-be-bonded together; and
        after adjoining, forming a plurality of plugs to electrically connect the plurality of chips in the two wafers, wherein:
            each chip has a corresponding plug that is un-coupled to other chips, and
            each plug is electronically connected to a respective redistribution interconnection structure spaced apart from each other.

2. The packaging method according to claim 1, wherein each wafer includes a front side surface and, opposite to the front side surface, a back side surface, and adjoining the two wafers includes:
    adjoining the two wafers with the front side surface of one wafer facing to the front side surface of another wafer; or
    adjoining the two wafers with the front side surface of one wafer facing to the back side surface of another wafer.

3. The packaging method according to claim 2, prior to forming the plurality of plugs, further including:
    performing a thinning-down process on the back side surface of one of the two wafers with the back side surface facing outside to reduce a thickness of the one of the two wafers to a target thickness, wherein:
        the thinning-down process includes at least one of mechanical grinding, chemical mechanical polishing, and etching.

4. The packaging method according to claim 1, wherein each wafer includes a front side surface and, opposite to the front side surface, a back side surface, and adjoining the two wafers includes:
    adjoining the two wafers with the back side surface of one wafer facing to the back side surface of another wafer.

5. The packaging method according to claim 4, prior to adjoining the two wafers, further including:
    performing a thinning-down process on the back side surface of one of the two wafers to reduce a thickness of the one of the two wafers to a target thickness, wherein:
        the thinning-down process includes at least one of mechanical grinding, chemical mechanical polishing, and etching.

6. The packaging method according to claim 1, wherein forming the plurality of plugs further includes:
    forming a plurality of vias in at least one wafer of the two wafers that are bonded together; and
    filling a conductive material into each via to form a plug electrically connected to a corresponding chip.

7. The packaging method according to claim 1, wherein:
    the redistribution interconnection structure includes a rewiring layer and a soldering pad, or a soldering pad.

8. The packaging method according to claim 1, wherein:
    at least three wafers, each wafer containing a plurality of chips, are bonded together along the direction perpendicular to the surfaces of the at least three wafers.

9. The packaging method according to claim 8, further including:
    providing another wafer containing a plurality of chips, and
    further bonding the another wafer with one wafer of a plurality of bonded wafers.

10. The packaging method according to claim 1, wherein:
    the two wafers are bonded through a fusion bonding process, a silicon-silicon direct bonding process, or an adhesive bonding process.

11. A wafer-level SiP structure, comprising:
    at least two wafers, each wafer containing a plurality of chips, bonded along a direction perpendicular to surfaces of the at least two wafers; and
    a plurality of plugs, electrically connecting the plurality of chips in two wafers of the at least two wafers, wherein:
        each chip has a corresponding plug that is un-coupled to other chips, and
        each plug is electronically connected to a respective redistribution interconnection structure spaced apart from each other.

12. The wafer-level SiP structure according to claim 11 including the two wafers that are bonded together, wherein each wafer includes a front side surface and, opposite to the front side surface, a back side surface, and:
    the front side surface of one wafer is bonded to the front side surface of another wafer; or
    the front side surface of one wafer is bonded to the back side surface of another wafer; or
    the back side surface of one wafer is bonded to the back side surface of another wafer.

13. The wafer-level SiP structure according to claim 11, wherein the plurality of plugs are formed on one side of the plurality of chips, and the wafer-level package structure further includes:
    a plurality of interconnection wires, formed on a same side of the plurality of chips as the plurality of plugs, and electrically connecting the plurality of plugs and the plurality of chips.

14. The wafer-level SiP structure according to claim 11, wherein:

the redistribution interconnection structure includes a rewiring layer and a soldering pad, or a soldering pad only.

15. The wafer-level SiP structure according to claim 11, further including:
a bonding layer formed at an interface between wafers that are bonded together.

16. The wafer-level SiP structure according to claim 11, further including:
a passivation layer covering the plurality of redistribution interconnection structures.

17. The packaging method according to claim 6, wherein:
the plurality of vias are formed by etching a portion of a wafer until partially exposing chips in the wafer.

18. The packaging method according to claim 1, wherein:
the plurality of plugs are formed on a same side of the plurality of chips.

19. The packaging method according to claim 1, wherein, prior to forming the plurality of plugs, the method further includes:
forming a plurality of interconnection wires to electrically connect the plurality of chips.

20. The packaging method according to claim 1, further including:
forming a plurality of metal interconnection wires over respective redistribution interconnection structures.

\* \* \* \* \*